United States Patent [19]
Bozarth et al.

[11] 4,149,160
[45] Apr. 10, 1979

[54] MULTI-INPUT SIGNAL COMPARATOR AND INDICATOR CIRCUIT

[75] Inventors: Theodore B. Bozarth, Perkasie; Martin Zielinski, Maple Glen, both of Pa.

[73] Assignee: Honeywell Inc., Minneapolis, Minn.

[21] Appl. No.: 873,100

[22] Filed: Jan. 30, 1978

[51] Int. Cl.² .............................................. G08B 21/00
[52] U.S. Cl. ................................. 340/661; 307/360; 328/148
[58] Field of Search ...................... 340/657, 661, 664; 328/148; 307/351, 356, 360

[56] References Cited

U.S. PATENT DOCUMENTS

| | | | |
|---|---|---|---|
| 2,958,823 | 11/1960 | Rabier | 340/661 X |
| 3,021,514 | 2/1962 | Regis et al. | 328/148 X |
| 3,072,895 | 1/1963 | Kaufman | 340/661 |
| 3,122,729 | 2/1964 | Bothwell et al. | 340/661 X |
| 3,341,816 | 9/1967 | Davis et al. | 340/661 X |
| 3,351,927 | 11/1967 | Stinson | 328/148 X |
| 3,457,560 | 7/1969 | McKinley | 340/661 |
| 3,534,353 | 10/1970 | Calkin et al. | 340/661 X |
| 3,641,546 | 2/1972 | Blackburn | 340/661 |
| 3,813,665 | 5/1974 | Parfomak et al. | 328/148 X |
| 3,916,399 | 10/1975 | Bishop et al. | 340/661 X |

Primary Examiner—Donald J. Yusko
Assistant Examiner—Daniel Myer
Attorney, Agent, or Firm—Laurence J. Marhoefer; Lockwood D. Burton; Mitchell J. Halista

[57] ABSTRACT

A multi-input signal comparator and indicator circuit for comparing a plurality of signal levels with a reference level and an indicator circuit arranged to respond to a comparator output signal for indicating an error in any of the comparator input signals. A high and a low comparator is used for each input signal to provide a "window" comparison while separate indicators provide a readout of high and low errors.

6 Claims, 1 Drawing Figure

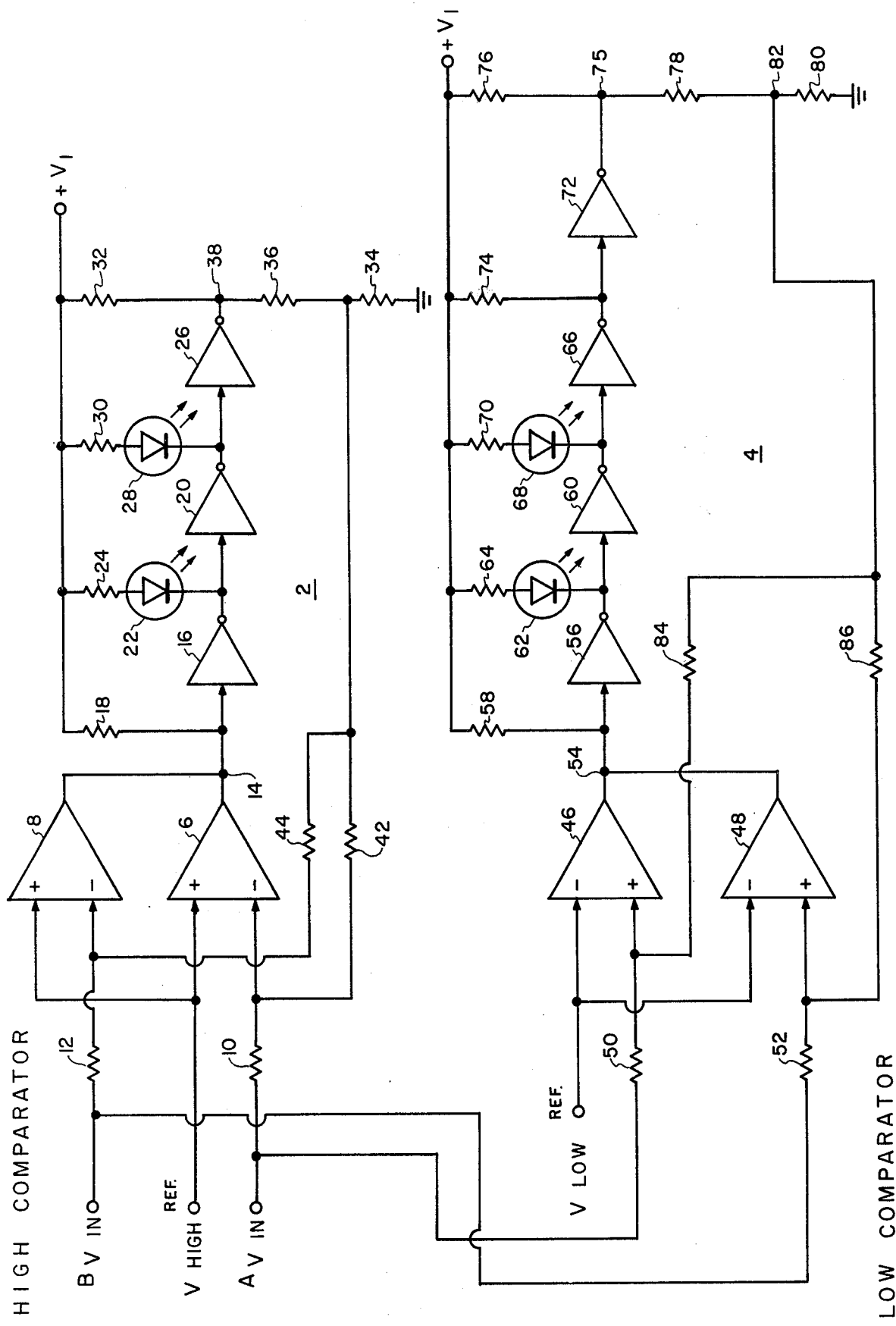

MULTI-INPUT SIGNAL COMPARATOR AND INDICATOR CIRCUIT

BACKGROUND OF THE INVENTION

1. Field of the Invention

The present invention is directed to signal comparator circuits. More specifically, the present invention is directed to a multi-input signal comparator circuit having a common comparator output indicator circuit.

SUMMARY OF THE INVENTION

An object of the present invention is to provide an improved multi-input signal comparator circuit having a common comparator output indicator circuit.

In accomplishing this and other objects, there has been provided in accordance with the present invention, a multi-input signal comparator circuit for comparing a plurality of input signal levels with a reference level signal. A shared common indicator circuit is arranged to respond to a comparator output signal to indicate an error in any of the comparator input signals.

BRIEF DESCRIPTION OF THE DRAWING

A better understanding of the present invention may be had when the following detailed description is read in connection with the accompanying drawing, in which the single figure is a schematic illustration of an example of the multi-input signal comparator and indicator circuit embodying the present invention.

DESCRIPTION OF THE PREFERRED EMBODIMENT

Detailed Description

Referring to the single figure drawing in more detail, there is shown an example of a multi-input signal comparator and indicator circuit having a high comparator section 2 and a low comparator section 4. The high comparator section 2 has a plurality of comparator circuits which are illustrated in exemplary form as comparators 6 and 8. It should be noted that, while only two comparators are shown, the circuit may be utilized with a large number of comparator circuits which are connected in a manner as shown by the illustrated comparator circuits. The number of comparator circuits would depend on the number of input signals to be compared with the reference level signal. For example, if the comparator circuits are used to test the circuit voltages on a printed circuit, or PC, board connector support structure, or backplane, the comparator circuits would be mounted on a PC board to be inserted in place of a regular operating circuit PC board into a printed circuit board connector mounted on the backplane. The number of comparators for each signal test operation would correspond to the number of circuits to be tested, e.g., forty-three comparators for a high level signal test.

The reference signal $V_{High\ Ref.}$ is applied to the positive, or non-inverting, input terminal of the comparators 6 and 8. A first input signal $AV_{in}$ is applied to the negative, or inverting, input of the first comparator 6. A second input signal $BV_{in}$ is applied through a second resistor 12 to the negative, or inverting, input of the second comparator 8. The outputs of the comparators 6 and 8 are wired-OR at a common junction point 14. The wired-OR junction 14 is connected to the input of a first inverter 16 and through a resistor 18 to a positive D.C. (direct current) voltage source $+V1$. The output of the first inverter 16 is connected to the input of a second inverter 20 and to one side of a light emitting diode (LED) 22. The other side of the LED 22 is connected through a resistor 24 to the positive voltage source $+V1$. The output of the second inverter 20 is connected to the input of a third inverter 26 and to one side of second LED 28. The other side of the LED 28 is connected through a resistor 30 to the positive voltage source $+V1$. The output of the third inverter 26 is connected through a resistor 32 to the source $+V1$ and through a series pair of resistors 34, 36 to a ground terminal. Specifically, the output of the third inverter 26 is connected to a junction 38 between the resistor 32 and the resistor 34. A junction 40 between the resistor 34 and the third resistor 36 is connected to supply positive feedback signal to the comparators 6 and 8. Specifically, a first feedback resistor 42 is connected between the junction 40 and the inverting input of the first comparator 6 while a second feedback resistor 44 is connected between the junction 40 and the inverting input of the second comparator 8.

The low comparator circuit 4 also is illustrated with an example of two comparators 46 and 48 which may be expanded to accommodate the number of input signals to be tested and would usually be equal in number to the number of comparators found in the high comparator portion 2. A reference signal for the low signal comparison test from a source $V_{Low\ Ref.}$ is connected to the inverting input of the third and fourth comparators 46 and 48. The inputs $AV_{in}$ and $BV_{in}$ are connected to the noninverting inputs of the comparators 46 and 48 through input resistors 50 and 52, respectively. The outputs of the third and fourth comparators 46 and 48 are also wired-OR at a common junction 54. The junction 54 is connected to the input of a fourth inverter 56 and through a resistor 58 to the voltage source $+V1$. The output of the fourth inverter 56 is connected to the input of a fifth inverter 60 and to one side of a third LED 62. The other side of the third LED 62 is connected through a resistor 64 to the positive source $+V1$. The output of the fifth inverter 60 is connected to the input of a sixth inverter 66 and to one side of a fourth LED 68. The other side of the fourth LED 68 is connected by a resistor 70 to the voltage source $+V1$. The output of the sixth inverter is connected to the input of seventh converter 72 and through a resistor 74 to the voltage source $+V1$. The output of the seventh inverter 72 is connected through a resistor 76 to the source $+V1$ and through a series pair of resistors 78 and 80 to a ground terminal. A junction 82 between the resistors 78 and 80 is connected to supply a positive feedback signal to the comparators 46 and 48 through resistors 84 and 86, respectively.

MODE OF OPERATION

In operation, the comparator circuits of the present invention compare the input signals applied to the respective comparators with the corresponding reference level signals. Specifically, the high comparator section 2 compares the input signals $AV_{in}$ and $BV_{in}$ with the high reference level signal $V_{High\ Ref.}$ by having each comparator in this section, e.g., comparators 6, 8, perform respective input signal comparison operations. Inasmuch as the comparison operation performed by the high comparator section 2 is a test to determine whether or not the input signal being tested is lower than $V_{High\ Ref.}$, the decision made by the comparators 6 and 8 involves a shift, or change, in the respective comparator output signals if the input signal is higher than $V_{High\ Ref}$. In other words, the output signals of the comparators 6 and 8 indicative of a correct input signal, i.e., an input signal lower than $V_{High\ Ref}$ are high level signals. This high level signal is inverted by the first inverter 16 and appears as a low level signal at the output of the first inverter 16. The LED indicators 22 and 28 in the high comparator section 2 are arranged to have characteristic visual colors when producing a visual indication, e.g., the first indicator 22 is selected to provide a green indication while the second indicator 28 is arranged to provide a red indication. During the error-free output signals of the comparators 6 and 8 the first indicator 22 is connected between the positive potential source +V and a low potential appearing at the output of the first inverter 16. Accordingly, the first indicator 22 is biased in a current conducting direction and is energized to produce a visual indication, i.e., a green illumination, to indicate an error-free comparison operation by the comparators 6 and 8. The output signal of the first inverter 16 is inverted by the second inverter 20 and is applied as a high level signal on one side of the second indicator 28. Since the second indicator 28 is consequently connected between a high level output signal and a similar high level positive voltage +V1, the second indicator 28 is not energized to produce a visual indication. Thus, for all of the comparison operations produced by the comparators 6 and 8 in the high comparator section 2 during an error-free condition of the input signals, the green LED 22 is energized to indicate an error-free status.

The high level output of the second inverter 20 is inverted by the third inverter 26 to a low level signal and is applied to the resistors 34 and 36 to produce a feedback signal to the comparators 6 and 8. This feedback signal is a positive feedback signal inasmuch as it has been inverted and, accordingly, is applied to the corresponding comparator input terminal, i.e., the inverting input terminal. The positive feedback signal is limited in amplitude by the ratio of the resistors 34 and 36 to control the comparators 6 and 8 without producing an oscillation. A typical value for the illustrated circuit during an error-free operation wherein a low level output signal would be present at the output of the third comparator 26 is approximately four millivolts.

On the other hand if one of the input signals exceeds the $V_{High\ Ref}$ signal applied to the comparators 6 and 8, the comparator receiving that excessive input signal will shift, or switch, its output signal to a low level output signal. This low level output signal is connected to the junction 14 to be applied to the first inverter 16 inasmuch as the junction 14 serves to produce a logical "or" function. In response to the low level input signal at its input, the output of the first inverter 16 is a high level output signal. The high level output signal from the inverter 16 is effective to extinguish the first LED 22 to terminate its visual indication inasmuch as the first LED 22 is no longer connected between the positive source +V1 and a low level signal at the output of the first inverter 16. On the other hand, the low level output signal from the first inverter 16 is inverted by the second inverter 20 and is applied to the input of the third inverter 26 and to one side of the LED 28. This state of the signals applied to the LED 28 to bias the LED 28 in a current conducting direction is effective to energize the LED 28 to produce a visual indication, i.e., a red illumination, thereof. The visual indication of LED 28 is arranged to be indicative of an error in one of the input signals connected to the comparators 6 and 8. The output from the second inverter 20 is also applied to the input of the third inverter 26 and is inverted to a high level output signal at the junction 38. This high level output signal is effective to raise the feedback signal at junction 42 to approximately a twenty-five millivolt signal.

The operation of the low comparator section 4 is similar to that described above for the high comparator section 2 with the exception that the comparators 46 and 48 illustrated in the low comparator section 4 are arranged to determine whether or not the input signals are higher than the $V_{Low\ Ref}$ signal used as the basis for comparison and an additional logic inversion is used to provide the proper positive feedback. Accordingly, the input signals are applied to the noninverting, i.e., positive, input terminals of the comparators 46 and 48 while the $V_{Low\ Ref}$ signal is applied to the inverting, i.e., negative, inputs of the comparators 46 and 48. The output signals of the comparators 46 and 48 indicative of a correct level of the input signals, i.e., input signals higher than $V_{Low\ Ref}$ are high level output signals. The junction 54 is effective to produce a logic "or" operation to represent the comparator output signals by a single high level output signal. This high level output signal is inverted by the inverter 56 and is applied to one side of the LED 62. The LED 62 is arranged to produce a green visual indication similar to that produced by the LED 22 in the high comparator section 2. Since the LED 62 is connected between the source +V1 and the low level signal at the output of the fourth comparator 56 during a correct state of the input signals applied to the comparators 46 and 48, the LED 62 is biased in a current conducting direction and is energized to produce a visual indication.

The low level signal at the output of the inverter 56 is applied to the inverter 60 and is inverted to a high level output signal at the output of the inverter 60. This high level output signal is applied to one side of the LED 68 and the input of the inverter 66. The high level signal applied to the LED 68 from the output of the inverter 60 is ineffective to energize the LED 68 inasmuch as the LED 68 is connected between two high level signals. Thus, the LED 68 is not energized to produce a visual representation during a correct, or error-free, state of the input signals applied to the comparators 46 and 48. The high level input signal to the comparator 66 is inverted by the comparator 66 to a low level signal and is inverted again by the inverter 72 to a high level signal. This high level signal is applied through resistor 78 to the junction 82 to be used as a feedback signal to the comparators 46 and 48. Inasmuch as this signal is a high level signal it is applied to the positive, or noninverting, input of the comparators 46 and 48.

If any one of the comparator input signals $A_{Vin}$, $B_{Vin}$ exceeds, i.e., is lower, than $V_{Low\ Ref}$ signal, the output signal of the corresponding comparator is switched to a low level output signal. This low level output signal is inverted by the inverter 56 to a high level output signal and is applied to the LED 62 to extinguish its previous energization. The high level output signal from the inverter 56 is inverted by the inverter 60 as applied to one side of the LED 68 as a low level signal. The combination of the low level signal at the output of the comparator 60 and the high level voltage +V1 applied to the other side of the LED 68 is effective to bias the LED 68 in a current conducting direction to produce a visual indication, i.e., a red illumination. This red illumination is arranged to be indicative of an error in the input signals compared by the low comparator section 4. Inasmuch as only four indicators are used by the combined high and low comparators sections 2, 4, the indicators, in one example, may be mounted on the front edge of a printed circuit card with the comparator and inverter circuitry mounted on the printed circuit card face whereby the printed circuit card may be plugged into a backplane connector with the comparator circuitry performing the comparison operations of the backplane voltages, as previously described, and the indicators indicating the condition of the tested backplane voltages.

The following is a list of circuit components used in a preferred construction of the illustrated example of the present invention:

Comparators 6, 8, 46, 48 — Motorola type 3302
Inverters 16, 20, 26, 56, 60, 66, 72 — Texas Instrument Type 7406
Indicators 22, 28, 62, 68 — Dialight Series 550
Resistors 10, 12, 50, 52 — 10K ohms
Resistors 18, 58 — 15K ohms
Resistors 24, 30, 64, 70 — 150K ohms
Resistors 42, 44, 84, 86 — 100K ohms
Resistors 32, 36, 76, 78 — 470K ohms
Resistors 34, 80 — 49.9K ohms
Resistor 74 — 15K ohms
V1 is +5 volts D.C.

Accordingly, it may be seen that there has been provided, in accordance with the present invention, a multi-input signal comparator and indicator circuit for comparing a plurality of input signals with a reference signal and for providing an indication of an error in the compared signals.

The embodiments of the invention in which an exclusive property or privilege is claimed are defined as follows:

1. A comparator and indicator circuit comprising
   a plurality of signal comparators with each of said comparators being arranged to compare a corresponding input signal with a reference signal,
   a first signal inverter circuit,
   means connecting all of the output signals from said comparators to an input of said inverter means,
   a first visual indicator means connected to an output of said comparator means to provide a visual indication of the state of an output signal from said comparator means,
   a second signal inverter means arranged to invert an output signal from said first inverter means, and
   a second indicator means connected to an output of said second inverter means to provide a visual indication of a state of an output signal from said second inverter means.

2. A comparison and indication circuit as set forth in claim 1 and including a third inverter means arranged to invert an output signal from said second inverter means and a feedback means arranged to apply an output signal from said third inverter means as a positive feedback signal concurrently to all of said plurality of comparator means.

3. A comparator and indicator circuit as set forth in claim 1 wherein a first predetermined number of said plurality of comparator means are arranged to determine a first type of error in the input signals being compared and a second predetermined number of said plurality of comparators are arranged to determine a second type of error in the input signals being compared and further including a first circuit means connecting said first predetermined number of said plurality of comparator means to said input of said first signal inverter circuit and wherein said indicator means includes a third inverting means for inverting an output from said second number of said plurality of comparators, second circuit means connecting said second number of said plurality of comparators to an input of said third inverting means,
   a third indicator means arranged to produce a visual indication of an error in an output signal from said third comparator means,
   a fourth inverter means arranged to invert an output signal from said third inverter means and
   a fourth indicator means arranged to indicate a state of an output signal from said fourth inverter means.

4. A comparison and indicator circuit as set forth in claim 1 wherein said first and second indicator means are light emitting diodes.

5. A comparison and indicator circuit as set forth in claim 3 and including a fifth inverter means arranged to invert an output signal from said second inverter means and a feedback means arranged to apply an output signal from said fifth inverter means as a positive feedback signal concurrently to all of said first number of said comparators.

6. A comparison and indicator circuit as set forth in claim 3 and including a sixth inverter means arranged to invert an output signal from said fourth inverter means and a feedback means arranged to apply an output signal from said sixth inverter means as a positive feedback signal concurrently to all of said second number of said comparators.

* * * * *